United States Patent
Elia

(10) Patent No.: US 7,868,700 B2
(45) Date of Patent: Jan. 11, 2011

(54) METHOD AND APPARATUS FOR REDUCING CURRENT CONSUMPTION OF MIMO SYSTEMS

(75) Inventor: Avner Elia, Ramat Ishai (IL)

(73) Assignee: Paragon Communications Ltd., Haifa (IL)

( * ) Notice: Subject to any disclaimer, the term of this patent is extended or adjusted under 35 U.S.C. 154(b) by 128 days.

(21) Appl. No.: 12/094,630

(22) PCT Filed: Nov. 28, 2006

(86) PCT No.: PCT/IL2006/001373

§ 371 (c)(1),
(2), (4) Date: Jun. 1, 2008

(87) PCT Pub. No.: WO2007/060676

PCT Pub. Date: May 31, 2007

(65) Prior Publication Data

US 2009/0021302 A1    Jan. 22, 2009

(51) Int. Cl.
*H03F 3/191* (2006.01)
(52) U.S. Cl. .................... 330/305; 330/124 R; 330/295
(58) Field of Classification Search ................ 330/305, 330/124 R, 295
See application file for complete search history.

(56) References Cited

U.S. PATENT DOCUMENTS

| | | | | |
|---|---|---|---|---|
| 4,663,599 | A * | 5/1987 | Patch | .......................... 330/311 |
| 5,276,912 | A | 1/1994 | Siwiak et al. | |
| 6,437,641 | B1 | 8/2002 | Bar-David | |
| 6,522,201 | B1 | 2/2003 | Hsiao et al. | |
| 6,552,634 | B1 * | 4/2003 | Raab | .......................... 333/216 |
| 6,804,500 | B2 * | 10/2004 | Yamaguchi | .............. 455/127.1 |
| 6,831,519 | B2 | 12/2004 | Bar-David et al. | |
| 6,894,562 | B2 * | 5/2005 | Nakayama et al. | ............ 330/53 |

(Continued)

FOREIGN PATENT DOCUMENTS

WO    2007010543    1/2007

OTHER PUBLICATIONS

Neo W C E et al: "Improved hybrid . . . networks" Bipolar/Bicmos Circuits and Techno. Meet., Procee. of the Santa Barbara, CA, USA, Oct. 9-11, 2005, IEEE, pp. 108-111, XP010861844.

(Continued)

*Primary Examiner*—Patricia Nguyen
(74) *Attorney, Agent, or Firm*—Marsteller & Associates, P.C.

(57) ABSTRACT

Apparatus and method for reducing the current consumption and increasing the efficiency of a MIMO system, consisting of one or more RF power amplifiers (PAs) and that is required to provide a desired total output power level. An individual output power level which is a portion of the total output power level is determined for each PA. The load, connected to the output stage of each PA, is dynamically or statically tuned to essentially match the output impedance of its output stage, such that its dynamic or static RF load line has a slope that corresponds to the impedance required to provide this portion. Whenever a smaller output power is desired in response to reduction in the input signal to MIMO system, a reduced portion is determined for each PA and the load is further tuned, such that the dynamic/static RF load line has a slope that causes each PA to essentially remain in saturation while providing the reduced portion.

6 Claims, 1 Drawing Sheet

U.S. PATENT DOCUMENTS

| | | |
|---|---|---|
| 7,119,621 B2 * | 10/2006 | Chen et al. .................. 330/295 |
| 7,512,386 B2 * | 3/2009 | Kalajo et al. ............. 455/127.1 |
| 2004/0018821 A1 | 1/2004 | Bar-David et al. |
| 2008/0258810 A1 | 10/2008 | Elia |

OTHER PUBLICATIONS

Duvanaud C et al: "Optimization of trade-offs..considerations" Microwave Symp. Digest, 1993, IEEE MTT-S Intl Atlanta GA, USA, Jun. 14-18, 1993, NY, USA,, pp. 285-288, XP010068217.

* cited by examiner

METHOD AND APPARATUS FOR REDUCING CURRENT CONSUMPTION OF MIMO SYSTEMS

FIELD OF THE INVENTION

The present invention relates to the field of high efficiency power amplifiers. More particularly, the invention is related to a method for reducing current consumption of RF power amplifiers in MIMO systems without changing their DC supply voltage.

BACKGROUND OF THE INVENTION

Traditional wireless communication systems use a single transmission path containing an amplifier and an antenna. Such systems are known as Single Input Single Output (SISO) systems. Multiple Input Multiple Output (MIMO) systems have link budget capacity and throughput superior to SISO systems. MIMO systems deliver greater performance, but with additional cost and power consumption. Thermal and battery life constraints limit tolerable power consumption in wireless portable devices. Moreover, the wireless standards limit the output power to certain levels. The requirement to support traditional SISO systems even aggravates the situation. In SISO mode, the transmitter should deliver the maximum power through one path. At the various MIMO modes (usually 2-4 transmitting antennas), each path should transmit less power; such that the overall power stays the same. Current consumption is expected not to change because total transmitting power stays the same, but generally, this is not practical. An amplifier designed to work at full power in SISO mode, when working at 3-5 dB less power in MIMO modes, leads to 30-55% increase in current consumption of the power amplifiers in the MIMO modes.

A conventional RF amplifier achieves its maximum efficiency at saturation level. Back off from that level reduces efficiency, but is usually required in order to meet output signal linearity conditions. In many wireless applications, several output power levels are required from the same amplifier. The power stage has to be designed to handle the highest power leading to very low efficiency at lower output power.

The technique of eXcess eNvelope eNhancement (XNN®) for power amplifiers (PA) is a solution for efficiency enhancement and power boost of power amplifiers, particularly for the low power WiFi and high power and low power WiMAX market applications, as well as for existing high power cellular applications and forthcoming cellular standards. Such solution is disclosed, for example in U.S. Pat. No. 6,831,519, in U.S. Pat. No. 6,437,641 and in US Patent Application No. 2004/0018821.

The Voltage Enhancement Circuit (VEC™) modulates the supply voltage of power amplifiers as part of the XNN® technology, disclosed in U.S. Pat. No. 6,437,641. Appropriate modulation of the supply voltage prevents saturation of power amplifiers while amplifying signals that exceed a pre-defined programmable threshold.

A MIMO system requires using of several power amplifiers, one for each transmitting path of the information signal. Conventional implementation of XNN® technology for this case requires using a VEC™ circuit for each replica of the signal. However, using several VEC™ circuits on one board might be expensive and area as well as power consuming. Therefore, a novel technique for reducing the number of VEC™ circuits required for the operation of a MIMO system is needed.

All the methods described above have not yet provided satisfactory solutions to the problem of efficiently providing power enhancement to several power amplifiers, arranged in a MIMO system.

It is an object of the present invention to provide a method for improving efficiency of MIMO amplifier arrays that supports also operating in a SISO mode.

It is another object of the present invention to provide a method for efficiently controlling the current drawn by power amplifiers, arranged in MIMO arrays.

It is another object of the present invention to provide circuitry for efficiently controlling MIMO transmitter current consumption, gain and output power independently.

Other objects and advantages of the invention will become apparent as the description proceeds.

SUMMARY OF THE INVENTION

The present invention is directed to a method for reducing the current consumption and increasing the efficiency of a MIMO system, consisting of one or more RF power amplifiers (PAs) and that is required to provide a desired total output power level. An individual output power level which is a portion of the total output power level is determined for each PA. The load, connected to the output stage of each PA, is dynamically or statically tuned to essentially match the output impedance of its output stage, such that its dynamic or static RF load line has a slope that corresponds to the impedance required to provide this portion. Whenever a smaller output power is desired in response to reduction in the input signal to MIMO system, a reduced portion is determined for each PA and the load is further tuned, such that the dynamic/static RF load line has a slope that causes each PA to essentially remain in saturation while providing the reduced portion.

Wherein whenever only a single PA is activated in the MIMO system, the efficiency of the MIMO system is increased by determining a reduced output power level for the PA, which is a portion of the total output power level. Then the load, connected to the output stage of the PA is dynamically or statically tuned, to essentially match the output impedance of its output stage, such that its dynamic or static RF load line has a slope that corresponds to the impedance required to provide this portion. The PA provides the desired total output power level by enhancing the DC power supplied to the PA, by a level that causes the dynamic or static RF load line to intersect the drain-source voltage at a value being closer to the maximal allowable swing, while essentially keeping its slope.

The PA may be operated under Class B, Class AB or Class C.

The present invention is directed to an apparatus for reducing the current consumption and increasing the efficiency of a MIMO system, consisting of one or more RF power amplifiers (PAs) and that is required to provide a desired total output power level, that comprises:

a matching circuitry for dynamically or statically tuning the load, connected to the output stage of each PA, to essentially match the output impedance of its output stage, such that its dynamic or static RF load line has a slope that corresponds to the impedance required to provide a portion of the total output power level, such that the dynamic or static RF load line has a slope that causes each PA to essentially remain in saturation while providing the reduced portion; and a power combining circuitry, for combining the power output of each PA to provide the total output power at the output of the MIMO system.

The apparatus may further comprise enhancement circuitry for enhancing the DC power supplied to the PA whenever only a single PA is activated in the MIMO system by a level that causes the dynamic or static RF load line to intersect the drain-source voltage of the PA at a value being closer to the maximal allowable swing, while essentially keeping its slope.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
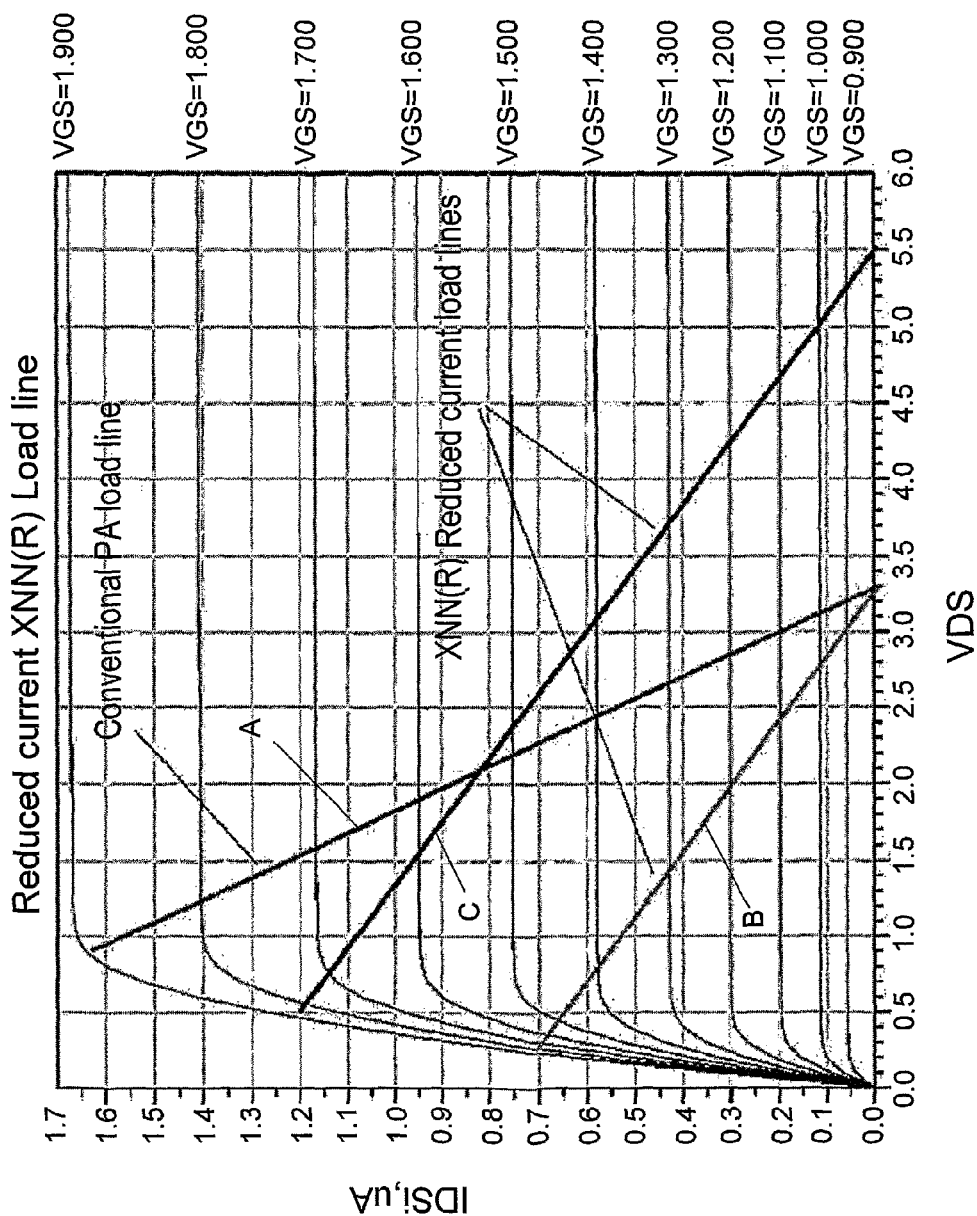
FIG. 1 schematically illustrates tuned load lines, according to a preferred embodiment of the invention.

A combination of two techniques for increasing the efficiency will be used for this purpose. XNN® method will be applied on the amplifier design to work in SISO mode. Adaptable or optimized load line will be applied to all MIMO amplifiers.

The modified load-line method increases efficiency at the expense of output power. The XNN® technology increases both efficiency and output power, which is not necessarily required in an existing design, where more output power is not needed. Neither method is useful for an existing design that needs only efficiency improvement. Only together, both methods are combined synergistically, to offer an amplifier with much higher efficiency and the same or slightly higher output power.

The solution proposed by the present invention suggests a combination of two efficiency-increasing techniques to achieve enhanced efficiency in SISO operational mode and improve efficiency in MIMO modes compared to the traditional implementation.

Two methods are combined and applied to a MIMO system to ensure efficiency improvement and reduced current consumption. The XNN® technology is applied to an amplifier designed to work also in SISO mode. This will yield about 20% increase in efficiency at SISO mode, compared to a traditional design. Adaptive load-line changing technique will be applied on all MIMO paths to ensure no efficiency degradation with reduced amplifiers output power.

Adaptive load line changing technique will be described below. Two kinds of RF matching techniques are commonly used for power amplifiers. Maximal Power Gain is achieved while using conjugate matching circuit. Higher output 1 dB compression, but lower power gain is achieved while using a power-matching circuit. In cases where the current and voltage limitations of the power transistors are dominant, power matching is usually used. In many situations, power matching yields 2 dB higher compression point, as described, for example, in Cripps, C. Steve, "RF Power Amplifiers for Wireless Communications", Artech House, 1999. This result is somewhat dependent on the transistor being matched. The load line of each amplifier in the MIMO system will be adapted to achieve the current consumption goal.

FIG. 1 schematically illustrates tuned load lines with enhancement, according to a preferred embodiment of the invention. Load line A is for a conventional class B power amplifier. Load line B is the XNN® power amplifier below threshold and Load line C is at maximum enhanced point. It can be noticed that only at maximum enhancement the XNN® power amplifier load line length exceeds the conventional PA load line length. This is the reason for enhanced efficiency of the XNN® power amplifier. The graph also clearly shows how reduced current mode is achieved. The efficiency in this case is improved. The method proposed herein also enables adaptive changing of the load line, matching the optimal load line for each power level. FIG. 1 also shows the XNN® influence on the load line enabling the higher output power required by the SISO path.

A technique for reducing the current of a power amplifier without affecting its output power or 1 dB compression point was described. The method allows using the XNN® technique for cases where current reduction is needed while neither output power enhancement is not needed, nor DC power supply voltage reduction is permitted. Significantly better RF power gain, compared to the compatible class of operation, and lower heat dissipation in the power transistor stage are additional benefits achieved while using this technique.

EXAMPLES

For specific MIMO system with up to four amplifier arms, the total power has been designed to stay constant for all operational modes, as appears for example, in the Wi-Fi IEEE 802.11n standard. For the case where only one amplifier operates (SISO mode), the power amplifier achieve highest efficiency using XNN® technology. If more arms are operating, the power of each of them is reduced by factor of the number of arms. Each of the MIMO arms was tuned to give maximum efficiency during MIMO operation. An adaptive load line control can be also applied on each of the MIMO arms if required.

A MIMO W-LAN system working according to the IEEE standard 802.11n with up to four transmit paths is described. Due to the to total output power limitations for systems operating in the unlicensed frequency bands, the total output power of such a MIMO system is limited to 100 mW (20 dBm).

If there are four Power Amplifiers (PAs) with maximum output power of 20 dBm for each PA, and with efficiency of 20% per PA at that output power, a method for changing the load line of each PA dynamically according to the number of simultaneously operating Pas is described, for example, in co-pending international application (attorney's docket # 21328-WO-06, derived from U.S. application Ser. No. 60/741,550). The incorporation of XNN® as described above in this invention allows using a fixed load line for each PA and still reducing current consumption and enhancing efficiency of the system in the following manner:

1. The load line of each PA is tuned such that it is tuned to output power of 17 dBm instead of the 20 dBm maximum $P_{out}$ of each PA. In this case, the efficiency of each PA remains 20%.
2. The XNN® circuitry is implemented to activate PA No. 1. When the system is working in the mode where only one PA is active (PA No. 1), the operation of the XNN® circuit increases the output power to 20 dBm according to the standard's limitations and the efficiency is increased up to 24% using to the XNN® technology.
3. When the system is working in the mode where two PAs are active simultaneously, the output power of each PA is 17 dBm producing a total output power from the system of 20 dBm. The total system efficiency is expected to be 20%.
4. When the system is working in the mode where three PAs are active simultaneously, the output power of each PA is 15 dBm producing a total output power from the system of 20 dBm. The total system efficiency might slightly degrade to 16%.

5. When the system is working in the mode where four PAs are active simultaneously, the output power of each PA is 14 dBm producing a total output power from the system of 20 dBm. The total system efficiency will further degrade to 14%. The efficiency degradation can be eliminated by using dynamic load line techniques as described in said co-pending application.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method for reducing the current consumption and increasing the efficiency of a MIMO system, consisting of two or more RF power amplifiers (PAs) having circuitry for enhancing the DC power supplied to said PAs and that are required to provide a desired total output power level, comprising:
   a) Determining an individual output power level for each PA, being a portion of said total output power level;
   b) dynamically or statically tuning the load, connected to the output stage of each PA, to essentially match the output impedance of its output stage, such that its dynamic or static RF load line has a slope that corresponds to the impedance required to provide said portion;
   c) whenever a smaller output power is desired in response to reduction in the input signal to MIMO system, determining a reduced portion for each PA; and
   d) further tuning said load, such that the dynamic/static RF load line has a slope that causes each PA to essentially remain in saturation while providing said reduced portion.

2. A method according to claim 1, wherein whenever only a single PA is activated in the MIMO system, increasing the efficiency of said MIMO system by:
   a) Determining a Reduced output power level for said PA, being a portion of said total output power level;
   b) dynamically or statically tuning the load, connected to the output stage of said PA, to essentially match the output impedance of its output stage, such that its dynamic or static RF load line has a slope that corresponds to the impedance required to provide said portion; and
   c) allowing said PA to provide the desired total output power level by enhancing the DC power supplied to said PA, by a level that causes said dynamic or static RF load line to intersect the drain-source voltage at a value being closer to the maximal allowable swing, while essentially keeping its slope.

3. A method according to claim 1, wherein the PA operated under the following classes:
   Class B;
   Class AB;
   Class C.

4. Apparatus for reducing the current consumption and increasing the efficiency of a MEMO system, consisting of two or more RF power amplifiers (PAs) having circuitry for enhancing the DC power supplied to said PAs and that are required to provide a desired total output power level, comprising:
   a) matching circuitry for dynamically or statically tuning the load, connected to the output stage of each PA, to essentially match the output impedance of its output stage, such that its dynamic or static RF load line has a slope that corresponds to the impedance required to provide a portion of said total output power level, such that the dynamic or static RF load line has a slope that causes each PA to essentially remain in saturation while providing said reduced portion; and
   b) power combining circuitry for combining the power output of each PA to provide the total output power at the output of said MIMO system.

5. Apparatus according to claim 4, further comprising enhancement circuitry for enhancing the DC power supplied to said PA whenever only a single PA is activated in the MIMO system by a level that causes said dynamic or static RF load line to intersect the drain-source voltage of said PA at a value being closer to the maximal allowable swing, while essentially keeping its slope.

6. Apparatus according to claim 4 or 5, wherein the PA operated under the following classes:
   Class B;
   Class AB;
   Class C.

* * * * *